(12) United States Patent
Li et al.

(10) Patent No.: US 11,757,080 B2
(45) Date of Patent: Sep. 12, 2023

(54) MULTI-SIDED LIGHT-EMITTING CIRCUIT BOARD AND MANUFACTURING METHOD THEREOF

(71) Applicants:Avary Holding (Shenzhen) Co., Limited., Shenzhen (CN); QING DING PRECISION ELECTRONICS (HUAIAN) CO.,LTD, Huai an (CN)

(72) Inventors: Zu-Ai Li, Shenzhen (CN); Mei-Hua Huang, Shenzhen (CN); Jin-Cheng Wu, Huai an (CN); Si-Hong He, Shenzhen (CN); Ning Hou, Shenzhen (CN)

(73) Assignees: Avary Holding (Shenzhen) Co., Limited., Shenzhen (CN); QING DING PRECISION ELECTRONICS (HUAIAN) CO., LTD, Huai an (CN)

( * ) Notice: Subject to any disclaimer, the term of this patent is extended or adjusted under 35 U.S.C. 154(b) by 262 days.

(21) Appl. No.: 17/260,515

(22) PCT Filed: Nov. 27, 2019

(86) PCT No.: PCT/CN2019/121289
§ 371 (c)(1),
(2) Date: Jan. 14, 2021

(87) PCT Pub. No.: WO2021/102742
PCT Pub. Date: Jun. 3, 2021

(65) Prior Publication Data
US 2021/0384394 A1 Dec. 9, 2021

(51) Int. Cl.
*H01L 33/62* (2010.01)
*H01L 25/075* (2006.01)
(Continued)

(52) U.S. Cl.
CPC .......... *H01L 33/62* (2013.01); *H01L 25/0753* (2013.01); *H01L 33/005* (2013.01);
(Continued)

(58) Field of Classification Search
CPC ................. H01L 33/62; H01L 25/0753; H01L 2933/0016; H01L 33/0486; H01L 25/0756;
(Continued)

(56) References Cited

U.S. PATENT DOCUMENTS 6,261,436 B1 * 7/2001 Chang ................. H01L 24/43
205/206
7,909,480 B2 * 3/2011 Kang ................... G02B 6/0083
362/249.02

(Continued)

FOREIGN PATENT DOCUMENTS

CN 103733244 A * 4/2014 ........... H01L 27/322
CN 105226167 B * 6/2017 ......... H01L 25/0753
(Continued)

*Primary Examiner* — Ismail A Muse
*Assistant Examiner* — David Paul Sedorook
(74) *Attorney, Agent, or Firm* — ScienBiziP, P.C.

(57) ABSTRACT

The present invention relates to a multi-sided light-emitting circuit board, which includes: a transparent substrate layer and a first conductive circuit layer on at least one surface of the transparent substrate layer. The first conductive circuit layer includes conductive portions arranged at intervals. A metal piece is formed on a surface of each conductive portion away from the transparent substrate layer. An accommodation space is formed between adjacent metal pieces. The accommodation space is provided with a light-emitting chip. Each light-emitting chip includes two electrodes. The two electrodes are respectively located at opposite ends of the light-emitting chip. The electrodes are respectively electrically connected to adjacent metal pieces. An encapsulant layer is formed on a surface of the first (Continued)

conductive circuit layer. The encapsulant layer covers and encapsulates the metal pieces and the light-emitting chips. The invention also relates to a method for manufacturing a multi-faceted light-emitting circuit board.

8 Claims, 3 Drawing Sheets

(51) Int. Cl.
     *H01L 33/00*          (2010.01)
     *H01L 33/38*          (2010.01)
     *H01L 33/54*          (2010.01)

(52) U.S. Cl.
     CPC .............. *H01L 33/38* (2013.01); *H01L 33/54* (2013.01); *H01L 2933/005* (2013.01); *H01L 2933/0016* (2013.01); *H01L 2933/0066* (2013.01)

(58) Field of Classification Search
     CPC ....... H01L 33/005; H01L 33/38; H01L 33/54; H01L 2933/005; H01L 2933/0066; H05K 1/81; H05K 3/284; H05K 3/305; H05K 3/321

See application file for complete search history.

(56) References Cited

U.S. PATENT DOCUMENTS

| | | | | |
|---|---|---|---|---|
| 11,005,009 B2 * | 5/2021 | Kim | ...................... | H01L 33/007 |
| 2008/0284330 A1 * | 11/2008 | Tachibana et al. | ....... | H01J 1/88 |
| | | | | 313/506 |
| 2018/0233536 A1 * | 8/2018 | Chang | .................... | H01L 27/15 |

FOREIGN PATENT DOCUMENTS

| | | | | |
|---|---|---|---|---|
| CN | 207266366 U | | 4/2018 | |
| CN | 108617089 A | | 10/2018 | |
| JP | WO 2006/011522 A1 * | | 2/2006 | ......... H01L 25/0753 |
| NA | 107590350 A * | | 1/2018 | |

* cited by examiner

MULTI-SIDED LIGHT-EMITTING CIRCUIT BOARD AND MANUFACTURING METHOD THEREOF

FIELD

The present invention relates to the technical field of circuit boards, in particular to a method for manufacturing a multi-sided light-emitting circuit board and the multi-sided light-emitting circuit board manufactured by the method.

BACKGROUND

Under the development trend of continuous miniaturization of light sources, among the RGB three-color LED light-emitting chips, the blue and green light chips have a single-sided double-electrode flip-chip structure, which enables the chip to be directly packaged on the substrate, and a size of a single package is reduced from the level of millimeters to micrometers, and the packaging process is relatively simple. In order to reduce packaging costs, LED light-emitting chips need to adopt a complex sink-bottom transfer process to convert the vertical structure into a single-sided dual-electrode flip-chip structure, and the RGB three-color light-emitting chips use the same packaging process.

In the existing light-emitting chip packaging technology, a single-sided light-emitting chip is usually mounted on a heat sink substrate or a heat-dissipating support. Single-side light-emitting chips are usually fabricated with a PN structure on one side of a sapphire substrate, and then packaged on the heat sink substrate through electrode production and metal leads. There are also flip-chip packaging methods to solder the electrodes of the chip onto the heat sink substrate as a flip-chip structure. However, with this type of packaging structure, the light-emitting chip has a single light emitting surface, and the light emitting efficiency is not high.

SUMMARY OF THE INVENTION

In view of this, it is necessary to provide a multi-sided light-emitting circuit board that can solve the above technical problems and a multi-sided light-emitting circuit board manufactured by this method.

A method for manufacturing a multi-sided light-emitting circuit board includes the steps:

Providing a copper-clad substrate, the copper-clad substrate including a transparent substrate layer and a first copper foil layer on at least one surface of the transparent substrate layer;

Forming the first copper foil layer into a first conductive circuit layer, the first conductive circuit layer revealing a portion of the transparent substrate layer, and the first conductive circuit layer includes a plurality of conductive portions arranged in an array;

Forming a metal piece on each of the conductive portions, a size of each metal piece smaller than a size of the conductive portion connected to it, and adjacent metal pieces are spaced apart to form an accommodation space;

Forming a transparent glue layer on a surface of the transparent substrate layer and in spaces formed by the conductive portions, the glue layer flush with the first conductive circuit layer; providing a light-emitting chip, the light-emitting chip including two electrodes, the two electrodes respectively located at opposite ends of the light-emitting chip, and the light-emitting chip arranged in the accommodating space so that the two electrodes at the opposite ends of the light-emitting chip are electrically connected to two adjacent metal pieces; and Forming an encapsulant layer on a surface of the first conductive circuit layer, the encapsulant layer encapsulating the metal pieces and the light-emitting chips.

In a preferred embodiment, after the glue layer is formed and before mounting the light-emitting chip to sidewalls of every two adjacent metal pieces, the method further includes:

Forming a conductive paste on each of the conductive portions, the conductive paste surrounding a sidewall of the metal piece connected to the conductive portion; and After the light-emitting chip is mounted on the sidewalls of every two adjacent metal pieces, performing a reflow soldering step, so that the light-emitting chip and the conductive paste are electrically connected.

In a preferred embodiment, the light-emitting chip includes a main body and two electrodes formed on two opposite end surfaces of the main body, each electrode is formed at a center position of the end surface, and a size of the electrode is smaller than a size of the end surface. The light-emitting chip has a surface that contacts the glue layer, and during the reflow step, the conductive paste also fills the space formed by the electrode and the main body.

In a preferred embodiment, both the glue layer and the encapsulant layer can transmit light; the glue layer is formed by spin coating, glue dispensing or printing, and the glue layer is cured.

In a preferred embodiment, the metal piece is a conductive protrusion, and the metal piece is formed by an electroplating process.

In a preferred embodiment, a height of the conductive protrusion is between 90 μm and 110 μm.

The invention also relates to a multi-sided light-emitting circuit board.

A multi-sided light-emitting circuit board, comprising: a transparent substrate layer and a first conductive circuit layer located on at least one surface of the transparent substrate layer; the first conductive circuit layer includes a plurality of conductive portions arranged in an array; a glue layer is provided between the adjacent conductive portions, the glue layer is flush with the first conductive circuit layer, and a metal piece is formed on the surface of each conductive portion away from the transparent substrate layer, a size of each of the metal pieces is smaller than a size of the conductive portion connected to it, an accommodating space is formed between the adjacent metal pieces, the accommodating space is provided with a light-emitting chip, each light-emitting chip includes two electrodes, the two electrodes are respectively located at opposite ends of the light-emitting chip, the two electrodes are respectively in electrical contact and conduction with two adjacent metal pieces, an encapsulant layer is also formed on a surface of the first conductive circuit layer, the encapsulant layer covers the metal pieces and the light-emitting chips.

In a preferred embodiment, a conductive paste is formed on each conductive portion, and the conductive paste surrounds a side wall of the metal piece connected with the conductive portion, and the two electrodes of the light-emitting chip are electrically connected to the conductive paste on the side wall of two different metal pieces, respectively.

In a preferred embodiment, the light-emitting chip includes a main body and two electrodes formed on two opposite end surfaces of the main body, each electrode is formed at a center position of the end surface, a size of the electrode is smaller than a size of the end surface, and the conductive paste also fills a space formed by the electrode and the main body.

In a preferred embodiment, the metal piece is a conductive protrusion, and a height of the conductive protrusion is between 90 micrometers and 110 micrometers.

Compared with the related art, the multi-sided light-emitting circuit board produced by the method for manufacturing the multi-sided light-emitting circuit board provided by the present invention uses a circuit board process to replace the flip-chip structure process technology, which reduces the cost. The general method can further reduce the distance between the light-emitting chips, and can make the light-emitting chips emit light from all sides and increase a light-emitting area of the light-emitting chips to improve light efficiency.

BRIEF DESCRIPTION OF THE DRAWINGS

Implementations of the present disclosure will now be described, by way of embodiments, with reference to the attached figures.

Figure 1:
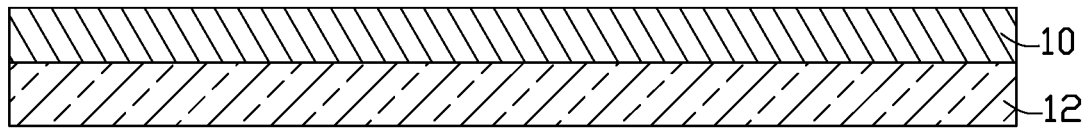
FIG. 1 is a cross-sectional view of a copper-clad substrate provided by the present invention.

SYMBOL DESCRIPTION OF MAIN COMPONENTS 100, 200 multi-sided light-emitting circuit board
1 copper-clad substrate
12 transparent substrate layer
10 first copper foil layer
14 first conductive circuit layer
140 conductive portion
2 Metal piece
20 accommodating space
3 glue layer
4 conductive paste
5 light-emitting chip
50 main body
52 electrode
51 end face
6 intermediate circuit board structure
7 encapsulant layer The following specific embodiments will further illustrate the present invention in conjunction with the above-mentioned drawings.

DETAILED DESCRIPTION

The technical solutions in the embodiments of the present invention will be described clearly and completely in conjunction with the accompanying drawings in the embodiments of the present invention. Obviously, the described embodiments are only a part of the embodiments of the present invention, rather than all the embodiments. Based on the embodiments of the present invention, all other embodiments obtained by those of ordinary skill in the art without creative work shall fall within the protection scope of the present invention.

Unless otherwise defined, all technical and scientific terms used herein have the same meaning as commonly understood by those skilled in the technical field of the present invention. The terms used in the specification of the present invention herein are only for the purpose of describing specific embodiments, and are not intended to limit the present invention.

The present invention relates to a manufacturing method of a multi-sided light-emitting circuit board 100, which includes the following steps:

Step 1: referring to FIG. 1, a copper-clad substrate 1 is provided. In this embodiment, the copper-clad substrate 1 is a single-sided copper-clad substrate. The copper-clad substrate 1 includes a transparent substrate layer 12 and a first copper foil layer 10 on at least one surface of the transparent substrate layer 12. A material of the transparent substrate layer 12 may be transparent polyimide (PI), transparent polyethylene terephthalate (PET), transparent polyethylene naphthalate (PEN), a glass substrate, or other materials. Of course, it can be understood that the transparent substrate layer 12 may be a rigid board substrate or a flexible board substrate. As long as it meets the characteristics of transparency and non-conductivity, it can be used for this. Therefore, the formed multi-sided light-emitting circuit board 100 can be a flexible circuit board or a rigid circuit board.

Figure 2:
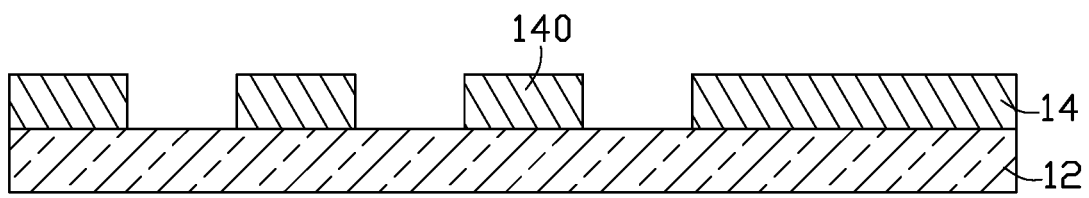
FIG. 2 is a cross-sectional view of forming a first copper foil layer included in the copper-clad substrate shown in FIG. 1 as a first conductive circuit layer.

Step 2: referring to FIG. 2, the first copper foil layer 10 is formed into a first conductive circuit layer 14, and the first conductive circuit layer 14 reveals a portion of the transparent substrate layer 12. The first conductive circuit layer 14 includes a plurality of conductive portions 140. The arrangement of the conductive portions 140 on the transparent substrate layer 12 can be arranged in a regular or irregular shape such as an array arrangement, a circular arrangement, a triangular arrangement, and the like. The conductive portion 140 may be a pad or a part of a conductive circuit pattern. The method of forming the first copper foil layer 10 into the first conductive circuit layer 14 can be a subtractive method. A dry film is first pasted on the surface of the first copper foil layer 10, then exposed, developed, and etched, and then the dry film is removed to form the first conductive circuit layer 14.

Figure 3:
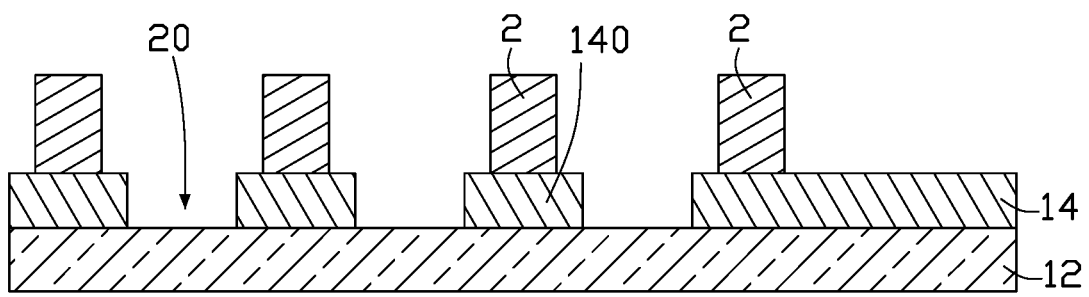
FIG. 3 is a cross-sectional view of a metal piece formed on the basis of FIG. 2.

Step 3: referring to FIG. 3, a metal piece 2 is formed on each of the conductive portions 140, and adjacent metal pieces 2 are spaced apart to form an accommodating space 20. The metal piece 2 may be a cylinder or a cuboid. A size of the accommodating space 20 is larger than a size of a light-emitting chip 5 to be arranged later. Each conductive portion 140 and the metal piece 2 connected to the conductive portion 140 are roughly an inverted T-shaped structure, that is, a size of the metal piece 2 is smaller than a size of the conductive portion 140 in contact with it. In this embodiment, the metal piece 2 is a conductive protrusion, and the metal piece 2 is formed by an electroplating process. The metal piece 2 formed by the electroplating process of the present invention is about 90 μm to 110 μm, preferably 100

μm. The electroplating process includes partial electroplating, composite electroplating, pulse electroplating, electroforming, mechanical plating, etc. A material of the metal protrusion can be nickel, chromium, copper, zinc, cadmium, alloys, and other conductive metal materials, and is not limited by this application.

Figure 4:
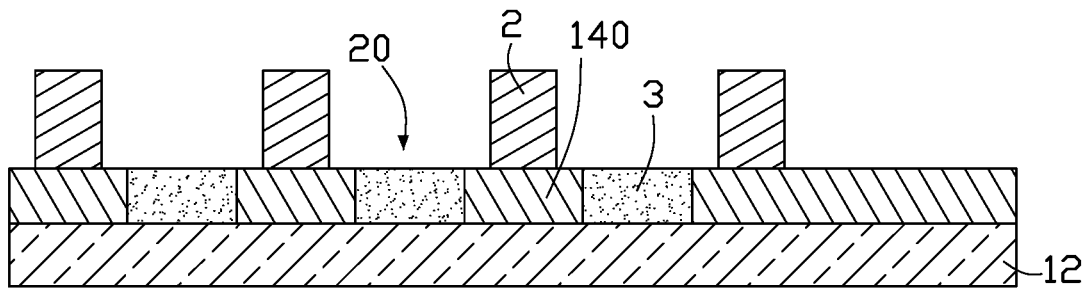
FIG. 4 is a cross-sectional view of a glue layer formed on a surface of a transparent substrate layer.

Step 4: referring to FIG. 4, a glue layer 3 is formed on a surface of the transparent substrate layer 12, and the glue layer 3 covers the surface of the transparent substrate layer 12 revealed by the first conductive circuit layer 14. The glue layer 3 is flush with the first conductive circuit layer 14. The glue layer 3 can be formed by spin coating, glue dispensing, or printing. Then, the glue layer 3 is cured by ultraviolet irradiation or baking. A material of the glue layer 3 may be an inorganic transparent material, such as silicon nitride, silicon oxynitride, etc., or an organic transparent material, such as polysiloxane. In addition, A method of curing the glue layer 3 can be ultraviolet irradiation or high-temperature baking. The specific method used can be determined according to an initiator added to prepare the glue layer 3. If the initiator is a photoinitiator (such as 2-hydroxy-2-methyl-1-phenylacetone, 1-hydroxycyclohexyl phenyl ketone, etc.), then ultraviolet irradiation is used. If the initiator is a thermal initiator (such as, benzoyl peroxide etc.), then high-temperature baking is used.

Figure 5:
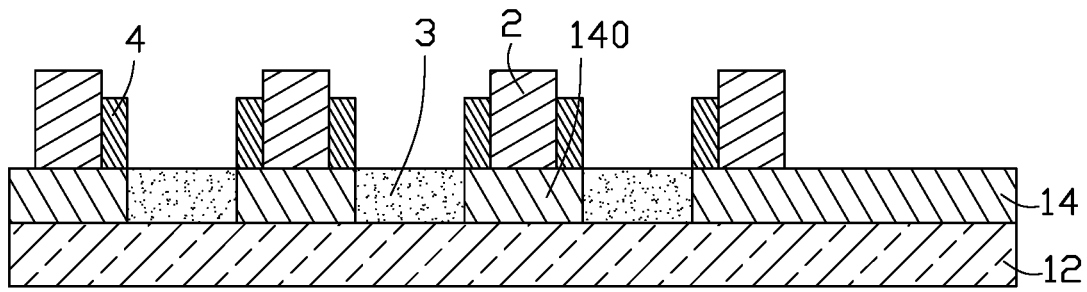
FIG. 5 is a cross-sectional view of a conductive paste formed on the basis of FIG. 4.

Step 5: referring to FIG. 5, a conductive paste 4 is formed on each of the conductive portions 140, and the conductive paste 4 surrounds a sidewall of the metal piece 2. The conductive paste 4 can be formed on the sidewall of each metal piece 2 by spot spraying. The conductive paste 4 may be conductive silver glue, conductive gold glue, conductive copper glue, or conductive carbon glue.

Figure 6:
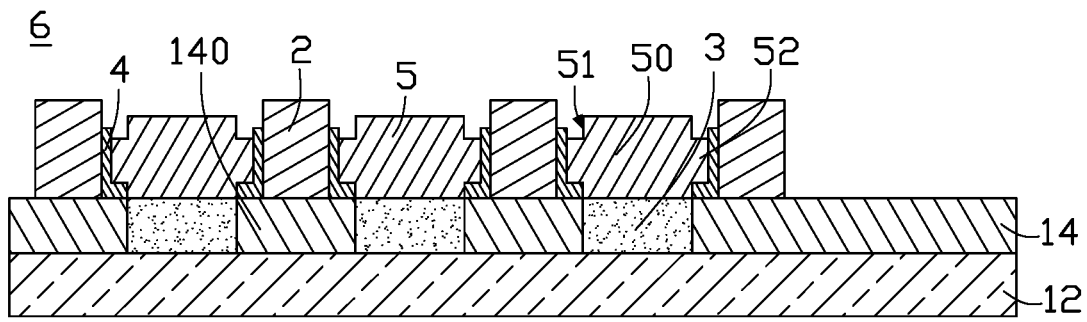
FIG. 6 is a cross-sectional view of providing a light-emitting chip and assembling the light-emitting chip on a surface of the glue layer and electrically connecting the light-emitting chip and the conductive paste.

Step 6: referring to FIG. 6, the light-emitting chip 5 is provided and assembled in the accommodating space 20 by using a surface mount technology (SMT). In this embodiment, the light-emitting chip 5 includes a main body 50 and two electrodes 52 formed on two opposite end faces 51 of the main body 50. Each electrode 52 is formed at a center position of the end face 51, and a size of the electrode 52 is smaller than a size of the end face 51. The light-emitting chip 5 is assembled into the accommodating space 20, and the two electrodes 52 included in each light-emitting chip 5 are connected to the conductive paste 4 on the side wall of the two adjacent metal pieces 2 to form an intermediate circuit board structure 6.

Step 7: the intermediate circuit board structure 6 is reflow soldered. During the reflow soldering step, the conductive paste 4 is melted and cooled at a high temperature and then fixedly attached to the side wall of the metal piece 2 and fills a space formed by the electrode 52 and the main body 50.

Figure 7:
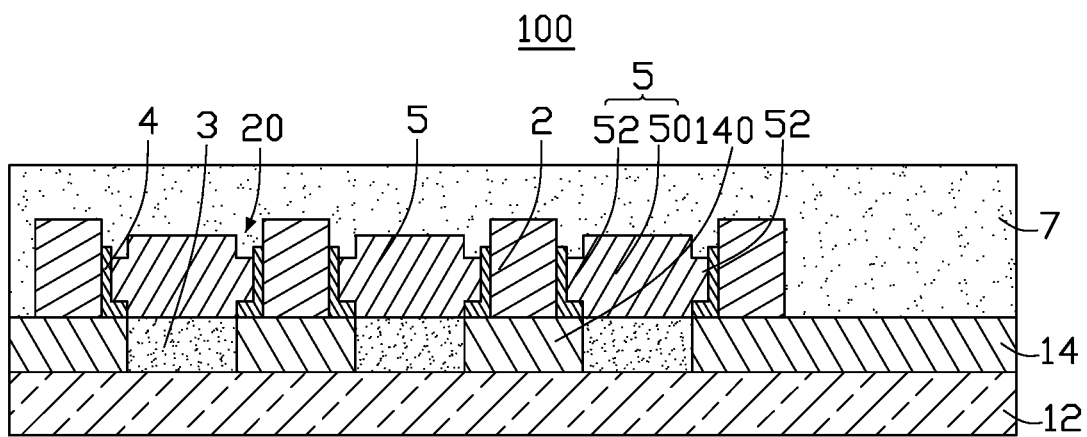
FIG. 7 is a cross-sectional view of a multi-sided light-emitting circuit board obtained after forming an encapsulant layer on a surface of the first conductive circuit layer.

Step 8: referring to FIG. 7, an encapsulant layer 7 is formed on a surface of the first conductive circuit layer 14. The encapsulant layer 7 encapsulates the metal piece 2 and the light-emitting chip 5, thereby obtaining the multi-sided light-emitting circuit board 100. In this embodiment, the encapsulant layer 7 is made of a light-transmitting material, such as polycarbonate, polymethyl methacrylate, or epoxy resin, so as to realize light emission in a front and lateral direction of the multi-faceted light emitting circuit board 100.

The invention also relates to a multi-sided light-emitting circuit board 100. The multi-sided light-emitting circuit board 100 includes a transparent substrate layer 12 and a first conductive circuit layer 14 on at least one surface of the transparent substrate layer 12. The first conductive circuit layer 14 includes a plurality of conductive portions 140 arranged in an array. The conductive portion 140 may be a pad or a part of a conductive circuit pattern. A transparent glue layer 3 is filled between adjacent conductive portions 140, and the glue layer 3 is flush with the first conductive circuit layer 14. A metal piece 2 is formed on a surface of each conductive portion 140 away from the transparent substrate layer 12. A size of each metal piece 2 is smaller than a size of the conductive portion 140 connected to it. An accommodating space 20 is formed between the adjacent metal pieces 2, and the accommodating space 20 is provided with a light-emitting chip 5. Each of the light-emitting chips 5 includes two electrodes 52, and the two electrodes 52 are respectively located at opposite ends of the light-emitting chip 5. The two electrodes 52 are in electrical contact and conduction with two adjacent metal pieces 2, respectively, and an encapsulant layer 7 is also formed on a surface of the first conductive circuit layer 14. The encapsulant layer 7 covers and packages the metal pieces 2 and the light-emitting chip 5.

In this embodiment, one surface of the light-emitting chip 5 supports the glue layer 3.

In this embodiment, the metal piece 2 is a conductive protrusion formed by an electroplating process, and a height of the conductive protrusion is between 90 μm and 110 μm. Preferably, the height of the conductive protrusion is 100 μm.

In this embodiment, a conductive paste 4 is formed on each conductive portion 140, and the conductive paste 4 surrounds a sidewall of the metal piece 2. The two electrodes 52 of the light-emitting chip 5 are electrically connected to the conductive paste 4 on different metal pieces 2, respectively. Specifically, the conductive paste 4 may be conductive silver glue, conductive gold glue, conductive copper glue, or conductive carbon glue.

In this embodiment, the light-emitting chip 5 includes a main body 50 and two electrodes 52 formed on two opposite end faces 51 of the main body 50. Each electrode 52 is formed at a center position of the end face 51, and a size of the electrode 52 is smaller than a size of the end surface 51. The conductive paste 4 also fills a space formed by the electrode 52 and the main body 50.

Figure 8:
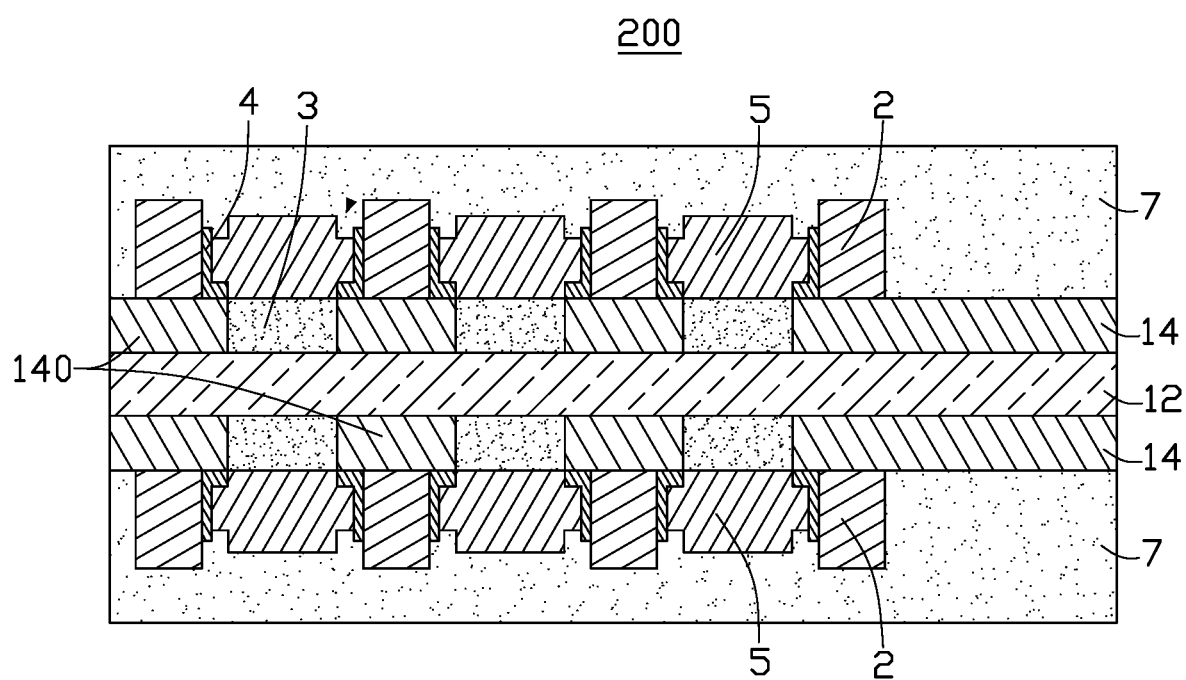
FIG. 8 is a cross-sectional view of a multi-sided light-emitting circuit board according to a second embodiment of the present invention.

Please refer to FIG. 8. FIG. 8 is a multi-sided light-emitting circuit board 200 according to a second embodiment of the present invention. A structure of the multi-sided light-emitting circuit board 200 is basically the same as that of the multi-sided light-emitting circuit board 100 provided in the first embodiment. The difference is that in this embodiment, the other surface of the transparent substrate layer 12 is also formed with the light-emitting chips 5, and a structure of the two opposite surfaces of the transparent substrate layer 12 are completely symmetrical. That is, the first conductive circuit layer 14 is also formed on the other surface of the transparent substrate layer 12. A transparent glue layer 3 is formed between the first conductive circuit layer 14. The first conductive circuit layer 14 includes a plurality of conductive portions 140 arranged in an array. A metal piece 2 is formed on a surface of each conductive portion 140 facing away from the transparent substrate layer 12. An accommodating space 20 is formed between the adjacent metal pieces 2, and the accommodating space 20 is provided with a light-emitting chip 5. Each of the light-emitting chips 5 includes two electrodes 52, and the two electrodes 52 are respectively located at opposite ends of the light-emitting chip 5. The two electrodes 52 are in electrical contact and conduction with two adjacent metal pieces 2, respectively, and an encapsulant layer 7 is also formed on a surface of the first conductive circuit layer 14. The encapsulant layer 7 covers and packages the metal pieces 2 and the light-emitting chips 5. A surface of the encapsulant layer 7 away from the light-emitting chips 5 is parallel to a surface of the transparent substrate layer 12 away from the light-emitting chips 5. In summary, the manufacturing method of the multi-sided light-emitting circuit board provided by the present invention produces the multi-sided light-emitting circuit boards 100 and 200. Because the circuit board manufacturing process is used instead of the flip-chip structure manufacturing process, the manufacturing cost of the multi-sided light-emitting circuit board is reduced. The chips 5 are assembled horizontally, which can further reduce a distance between the light-emitting chips 5 compared to the related art, and can make the light-emitting chips emit light from all sides and increase a light-emitting area of the light-emitting chips 5 to improve light efficiency.

It can be understood that the above embodiments are only used to illustrate the present invention, and are not used to limit the present invention. For those of ordinary skill in the art, various other corresponding changes and modifications made according to the technical concept of the present invention fall within the protection scope of the present invention.

What is claimed is:

1. A method for manufacturing a multi-sided light-emitting circuit board, the method comprising the following steps:
    providing a copper-clad substrate, the copper-clad substrate comprising a transparent substrate layer and a first copper foil layer on at least one surface of the transparent substrate layer;
    forming the first copper foil layer into a first conductive circuit layer, the first conductive circuit layer revealing a portion of the transparent substrate layer, and the first conductive circuit layer comprising a plurality of conductive portions arranged in an array;
    forming a metal piece on each of the conductive portions, a size of each metal piece smaller than a size of the conductive portion connected to the metal piece, and adjacent metal pieces spaced apart to form an accommodation space;
    forming a transparent glue layer on a surface of the transparent substrate layer and in spaces formed by the conductive portions, the glue layer flush with the first conductive circuit layer;
    providing light-emitting chip, the light-emitting chip comprising two electrodes, the two electrodes respectively located at opposite ends of the light-emitting chip, and the light-emitting chip arranged in the accommodating space so that the two electrodes at the opposite ends of the light-emitting chip are electrically connected to two adjacent metal pieces; and
    forming an encapsulant layer on a surface of the first conductive circuit layer, the encapsulant layer encapsulating the metal pieces and the light-emitting chips;
    wherein after the glue layer is formed and before mounting the light-emitting chip to sidewalls of every two adjacent metal pieces, the method further comprises:
    forming a conductive paste on each of the conductive portions, the conductive paste surrounding a sidewall of the metal piece connected to the conductive portion; and
    after the light-emitting chip is mounted on the sidewalls of each two adjacent metal pieces, performing a reflow soldering step, so that the light-emitting chip and the conductive paste are electrically connected.

2. The method for manufacturing a multi-sided light-emitting circuit board of claim 1, wherein:
    the light-emitting chip comprises a main body and two electrodes formed on two opposite end faces of the main body, each electrode is formed at a center position of the end surface, a size of the electrode is smaller than a size of the end surface, the light-emitting chip has a surface contacting the glue layer, and during the reflow step, the conductive paste fills a space formed by the electrode and the main body.

3. The method for manufacturing a multi-sided light-emitting circuit board of claim 1, wherein the glue layer and the encapsulant layer can transmit light; the glue is formed by spin coating, glue dispensing, or printing, and the glue layer is cured.

4. The method for manufacturing a multi-sided light-emitting circuit board of claim 1, wherein the metal piece is a conductive protrusion, and the metal piece is formed by an electroplating process.

5. The manufacturing method of a multi-sided light-emitting circuit board of claim 1, wherein the metal piece is a conductive protrusion, and a height of the conductive protrusion is between 90 μm and 110 μm.

6. A multi-sided light-emitting circuit board comprising:
    a transparent substrate layer and a first conductive circuit layer on at least one surface of the transparent substrate layer, the first conductive circuit layer comprising a plurality of conductive portions arranged in an array, a glue layer is arranged between adjacent conductive portions, the glue layer is flush with the first conductive circuit layer, a surface of each conductive portion away from the transparent substrate layer is formed with a metal piece, a size of each metal piece is smaller than a size of the conductive portion connected to the metal piece, an accommodation space is formed between adjacent metal pieces, the accommodation space is provided with a light-emitting chip, each light-emitting chip comprises two electrodes, the two electrodes are respectively located at opposite ends of the light-emitting chip; the two electrodes are respectively electrically contacted to two adjacent metal pieces; an encapsulant layer is formed on a surface of the first conductive circuit layer, and the encapsulant layer covers the metal pieces and the light-emitting chips;
    wherein a conductive paste is formed on each of the conductive portions, the conductive paste surrounds the sidewalls of the metal pieces connected to the conductive portions, the two electrodes of the light-emitting chip are electrically connected to the conductive paste on the side walls of two different metal pieces, respectively.

7. The multi-sided light-emitting circuit board of claim 6, wherein the light-emitting chip comprises a main body and two electrodes formed on two opposite end faces of the main body, each electrode is formed at a center position of the end surface, a size of the electrode is smaller than a size of the end surface, and the conductive paste fills a space formed by the electrode and the main body.

8. The multi-sided light-emitting circuit board of claim 6, wherein the metal piece is a conductive protrusion, and a height of the conductive protrusion is between 90 μm and 110 μm.

* * * * *